US011258385B2

(12) United States Patent
Ito et al.

(10) Patent No.: US 11,258,385 B2
(45) Date of Patent: Feb. 22, 2022

(54) MOTOR CONTROL DEVICE AND FEEDER (71) Applicant: FUJI CORPORATION, Chiryu (JP)

(72) Inventors: Mikine Ito, Toyohashi (JP); Tsutomu Kunihiro, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 6 days.

(21) Appl. No.: 16/479,268

(22) PCT Filed: Feb. 9, 2017

(86) PCT No.: PCT/JP2017/004753
§ 371 (c)(1),
(2) Date: Jul. 19, 2019

(87) PCT Pub. No.: WO2018/146774
PCT Pub. Date: Aug. 16, 2018

(65) Prior Publication Data
US 2019/0379311 A1 Dec. 12, 2019

(51) Int. Cl.
*H02P 8/12* (2006.01)
*H05K 13/02* (2006.01)
(52) U.S. Cl.
CPC .............. *H02P 8/12* (2013.01); *H05K 13/02* (2013.01)
(58) Field of Classification Search
CPC ................................. H02P 8/12; H05K 13/02
USPC ........................................................ 318/696
See application file for complete search history.

(56) References Cited

U.S. PATENT DOCUMENTS

| 3,952,238 A | * | 4/1976 | Cutler | ................. | G05B 19/416 |
| | | | | | 318/571 |
| 4,066,941 A | * | 1/1978 | Foster | .................... | G05B 19/23 |
| | | | | | 388/809 |
| 4,691,154 A | * | 9/1987 | Sato | ......................... | H02P 8/32 |
| | | | | | 318/567 |

(Continued)

FOREIGN PATENT DOCUMENTS

| JP | 6-54593 A | * | 2/1994 | ................ H02P 8/12 |
| JP | 2007-129054 A | | 5/2007 | |

(Continued)

OTHER PUBLICATIONS

International Search Report dated Apr. 25, 2017 in PCT/JP2017/004753 filed on Feb. 9, 2017.

*Primary Examiner* — Muhammad S Islam
*Assistant Examiner* — Devon A Joseph
(74) *Attorney, Agent, or Firm* — Oblon, McClelland, Maier & Neustadt, L.L.P.

(57) ABSTRACT

The motor control device is capable of driving control of the stepping motor with a pre-excitation that excites the stepping motor for a first time with a current lower than that during driving before starting or when starting driving the stepping motor, and a post-excitation that excites the stepping motor at a current lower than that during driving when stopping or after stopping the driving of the stepping motor for a second time, and is capable of continuing the post-excitation and the pre-excitation for a period of time shorter than the sum of the first time and the second time when the post-excitation at the previous stopping of driving of the stepping motor and the pre-excitation at the next starting of driving of the stepping motor are executed without passing through the non-excited state.

2 Claims, 4 Drawing Sheets

(56) References Cited

U.S. PATENT DOCUMENTS

| | | | | |
|---|---|---|---|---|
| 5,530,332 | A * | 6/1996 | Rees | H02P 8/10 318/260 |
| 5,623,464 | A * | 4/1997 | Tani | G11B 7/08529 369/30.17 |
| 5,892,742 | A * | 4/1999 | Yamashita | G11B 7/08541 369/44.27 |
| 6,008,609 | A * | 12/1999 | Sawashima | G05B 19/186 318/570 |
| 6,127,792 | A * | 10/2000 | Kamiya | B25J 9/1656 318/432 |
| 6,139,205 | A * | 10/2000 | Suzuki | B41J 19/202 400/76 |
| 6,459,229 | B1 * | 10/2002 | Kawanabe | H02P 8/04 318/696 |
| 6,927,880 | B2 * | 8/2005 | Hashizume | H04N 1/393 358/471 |
| 7,116,074 | B2 * | 10/2006 | Kuo | H02P 8/04 318/696 |
| 7,338,260 | B2 * | 3/2008 | Brundle | A61M 5/142 417/12 |
| 7,427,847 | B2 * | 9/2008 | Yoshihisa | B41J 19/202 318/685 |
| 9,181,057 | B2 * | 11/2015 | Mashiba | H02P 8/12 |
| 9,793,831 | B2 * | 10/2017 | Ogawa | H02P 6/182 |
| 9,960,716 | B2 * | 5/2018 | Ambruson | H02P 6/16 |
| 10,116,243 | B2 * | 10/2018 | Lu | H02P 6/186 |
| 10,181,810 | B2 * | 1/2019 | Lu | H02P 6/20 |
| 10,312,847 | B2 * | 6/2019 | Lu | H02P 6/18 |
| 10,732,583 | B2 * | 8/2020 | Rudser | A61M 60/148 |
| 2005/0205039 | A1 * | 9/2005 | Kamimura | F02D 41/064 123/179.18 |
| 2005/0218857 | A1 * | 10/2005 | Yamazaki | H02P 8/04 318/685 |
| 2007/0001642 | A1 * | 1/2007 | Yoshihisa | B41J 19/202 318/696 |
| 2010/0239290 | A1 * | 9/2010 | Ryu | H02P 8/10 399/53 |
| 2011/0001449 | A1 * | 1/2011 | Kim | H02P 8/12 318/696 |
| 2018/0294754 | A1 * | 10/2018 | Takeda | H02P 8/12 |

FOREIGN PATENT DOCUMENTS

| | | |
|---|---|---|
| JP | 5161693 B2 | 3/2013 |
| JP | 5408868 B2 | 2/2014 |

* cited by examiner

MOTOR CONTROL DEVICE AND FEEDER

TECHNICAL FIELD

The present specification discloses a motor control device and a feeder.

BACKGROUND ART

Conventionally, there has been proposed a feeder for supplying components to a component mounter by feeding tape accommodating the components by a predetermined amount by driving of a stepping motor (pulse motor) (for example, refer to patent literature 1). With such a feeder, a stepping motor is driven so as to feed a component to a supply position each time a component request signal transmitted from a component mounter is received. Further, the component mounter determines that the feeding operation of components by the feeder is completed when a predetermined feeding time has elapsed from the transmission timing of the component request signal, then picks up and mounts the component with a suction nozzle or the like. As a result, the influence of a communication delay can be eliminated and the tact time can be shortened as compared with a case where the feeder transmits a signal indicating the completion of component supply to the component mounter.

CITATION LIST

Patent Literature

Patent literature 1: JP-A-2007-129054

SUMMARY

Technical Problem

As described above, for a case where feeding operation such as supplying the components is performed by a stepping motor, it is desirable to shorten the tact time. There is ample room to improve control and the like of a stepping motor to shorten tact time and improve throughput.

A main object of the motor control device and feeder of the present disclosure is to improve throughput while appropriately driving a stepping motor.

Solution to Problem

A motor control device and feeder disclosed herein uses the following means to achieve the above object.

A motor control device of the present disclosure is configured to perform drive control of a stepping motor by performing a pre-excitation of excitation for a first time period at a current lower than that used during driving before starting or when starting the driving of the stepping motor, and post-excitation of excitation for a second time period at a current lower than that used during driving when stopping or after stopping the driving of the stepping motor, wherein, when performing the post-excitation during a previous stopping of driving of the stepping motor and the pre-excitation during a subsequent starting of driving of the stepping motor without transitioning via a non-excited state, the motor control device is configured to perform the post-excitation and the pre-excitation consecutively for a time that is shorter than a sum of the first time period and the second time period.

In a motor control device of the present disclosure, when performing the post-excitation during a previous stopping of driving of the stepping motor and the pre-excitation during a subsequent starting of driving of the stepping motor without transitioning via a non-excited state, the motor control device is configured to perform the post-excitation and the pre-excitation consecutively for a time that is shorter than a sum of the first time period and the second time period. This makes it possible to shorten the time from stopping rotation in the previous driving to the starting rotation in the next driving while performing the post-excitation and the pre-excitation for curtailing step-out of the stepping motor. Therefore, throughput can be improved while appropriately operating the stepping motor.

The feeder of the present disclosure includes the motor control device described above, and a feeder mechanism including a stepping motor driven and controlled by the motor control device, wherein a component is fed by driving of the stepping motor.

Since the feeder of the present disclosure is provided with the motor control device described above, it is possible to shorten the time from stopping rotation in the previous driving to the starting rotation in the next driving while performing the post-excitation and the pre-excitation for curtailing step-out of the stepping motor. Therefore, the tact time when consecutively feeding and supplying multiple components can be shortened and the throughput can be improved.

DESCRIPTION OF EMBODIMENTS

An embodiment of the disclosure is described below.

Figure 1:
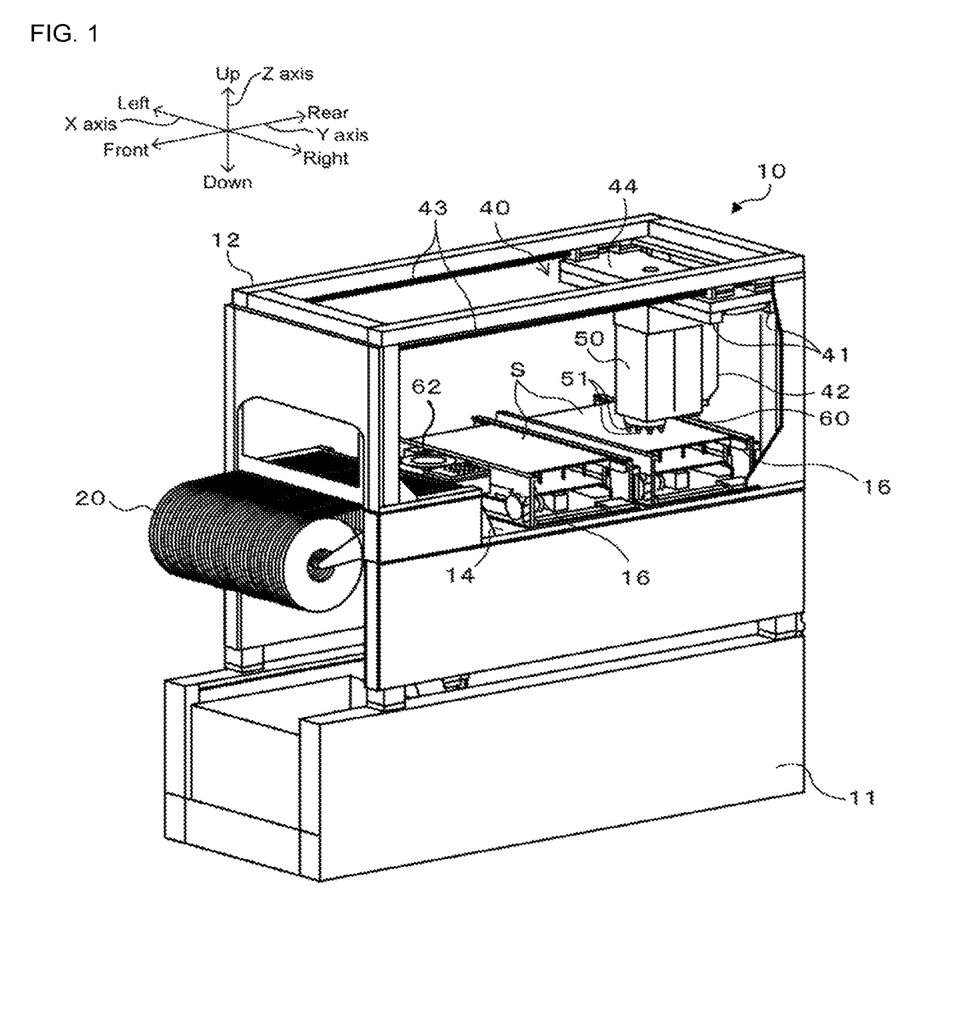
FIG. 1 is a configuration diagram of component mounter 10.
Figure 2:
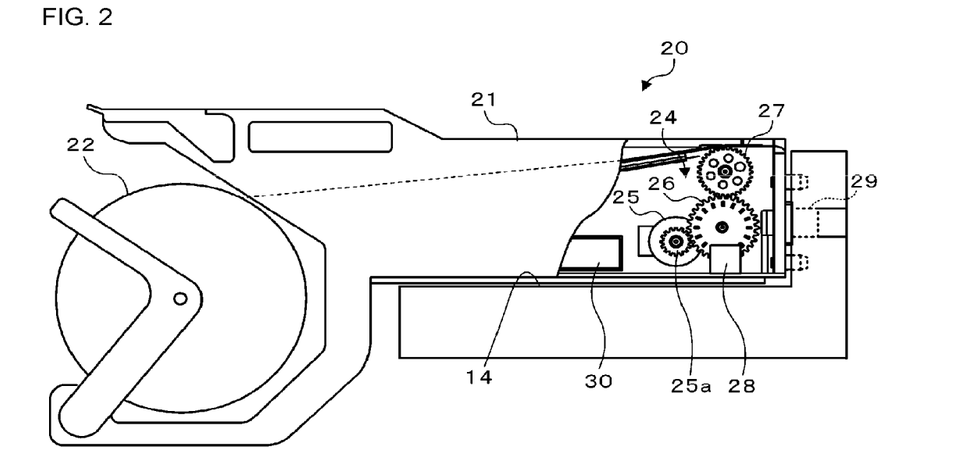
FIG. 2 is a configuration diagram of feeder 20.
Figure 3:
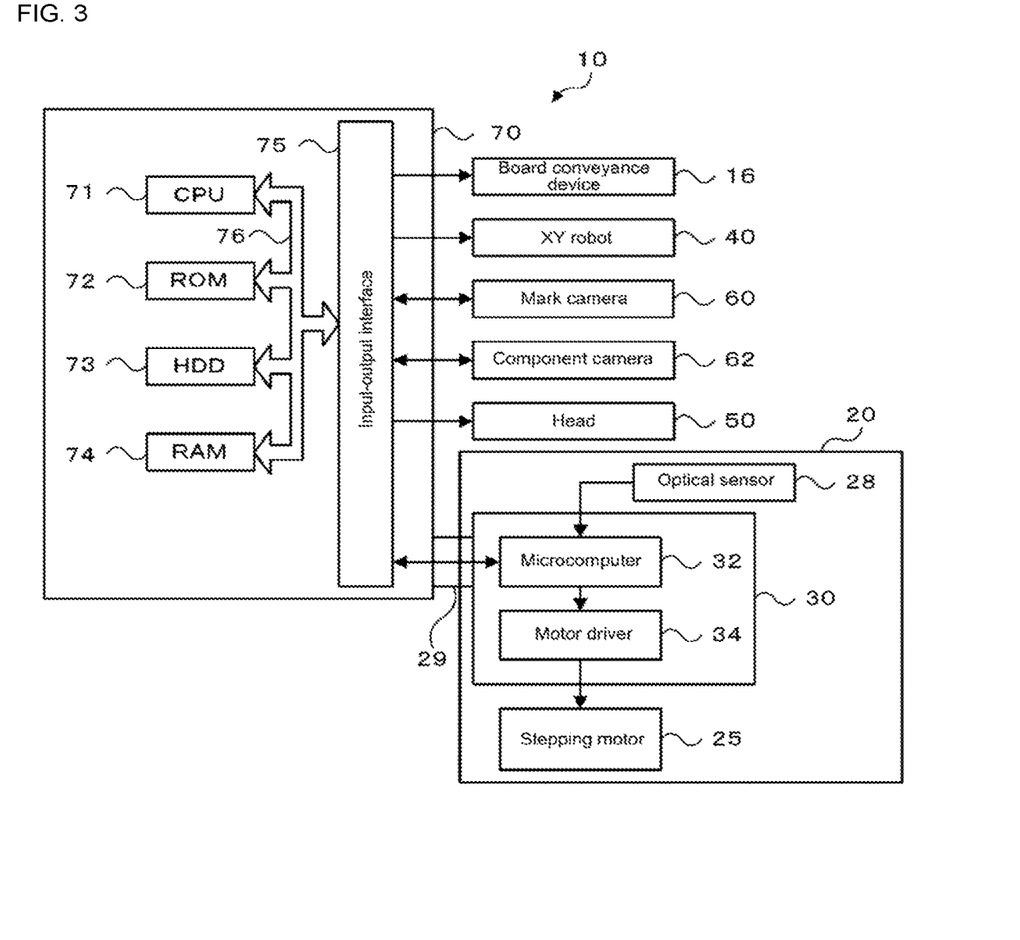
FIG. 3 is a diagram illustrating electrical connections of component mounter 10.

FIG. 1 is a configuration diagram of component mounter 10. FIG. 2 is a configuration diagram of feeder 20. FIG. 3 illustrates electrical connections of component mounter 10. Note that, in FIG. 1, the left-right direction is the X-axis direction, the front-rear direction is the Y-axis direction, and the up-down direction is the Z-axis direction.

As shown in FIG. 1, component mounter 10 includes base 11, main body frame 12 supported by base 11, and support table 14 provided on main body frame 12. Component mounter 10 includes board conveyance device 16, feeders 20, head 50, XY robot 40, and mounter controller 70 (see FIG. 3). In addition, component mounter 10 includes mark camera 60 provided on head 50 for capturing a reference mark attached to board S, component camera 62 for capturing an image of the pickup attitude of a component held by suction nozzle 51, and the like.

As shown in FIG. 1, board conveyance device 16 is a dual lane type conveyance device in which two board conveyance paths are provided. Board conveyance device 16 includes a belt conveyor device, and conveys the board S from the left to the right in FIG. 1 by driving the belt conveyor device. Board conveyance device 16 may be a single lane type conveyance device.

Head 50 picks up components using each of multiple suction nozzles 51, and mounts the components on board S conveyed by board conveyance device 16. Although not shown, head 50 includes an R-axis actuator for revolving the multiple suction nozzles 51, a θ-axis actuator for rotating (about their own axis) each suction nozzle 51, a Z-axis actuator for raising and lowering a suction nozzle 51 at a predetermined position, an electromagnetic valve for switching the suction at each suction nozzle 51 on and off, and the like.

XY robot 40 moves head 50 in the XY direction. As shown in FIG. 1, XY robot 40 includes Y-axis slider 44 and X-axis slider 42. Y-axis slider 44 is movable along a pair of left and right Y-axis guide rails 43 provided along the Y-axis direction at the upper level portion of main body frame 12. X-axis slider 42 is movable along an X-axis guide rail 41 provided along the X axis of the lower surface of Y-axis slider 44. Head 50 is attached to X-axis slider 42. Mounter controller 70 is configured to move head 50 to any position on the XY plane by driving and controlling XY robot 40.

As shown in FIG. 1, feeders 20 are removably mounted on support table 14 with multiple feeders 20 being arranged on support table 14 lined up in the left-right direction (X-axis direction). As shown in FIG. 2, feeder 20 is a tape feeder including case 21 and reel 22 on which carrier tape is wound. Case 21 accommodates tape feeding mechanism 24 that pulls out the carrier tape from reel 22 and feeds the components accommodated in the carrier tape to a supply position at which suction nozzle 51 of head 50 performs pickup, and feeder controller 30 that controls the operation of feeder 20. Note that, the carrier tape is configured from bottom tape in which are formed cavities (recesses) at a specified pitch in the lengthwise direction, and top film attached to a top surface of the bottom tape, with a component being stored in each of the cavities. With the carrier tape, the top film is peeled off from the bottom tape before the supply position by a peeling section, which is not shown, to expose the component such that the component can be picked up by suction nozzle 51. Sprocket holes (not shown) for engaging sprocket teeth of sprocket 27, which will be described later, are formed at predetermined intervals in the vicinity of an edge of the bottom tape.

Tape feeding mechanism 24 includes stepping motor 25, transmission gear 26 that engages with gear 25a provided on a rotation shaft of stepping motor 25, and sprocket 27 formed with sprocket teeth that engage with transmission gear 26. Tape feeding mechanism 24 engages the sprocket teeth of sprocket 27 with the sprocket holes formed in the carrier tape, and intermittently rotates sprocket 27 via transmission gear 26 by the driving of stepping motor 25. As a result, tape feeding mechanism 24 pulls out the carrier tape from reel 22 and pitch feeds the carrier tape. Further, tape feeding mechanism 24 includes optical sensor 28 having a light emitting element and a light receiving element that face each other with transmission gear 26 interposed therebetween. Optical sensor 28 detects the presence or absence of a slit in transmission gear 26.

As shown in FIG. 3, feeder controller 30 includes microcomputer 32 including a CPU, ROM, RAM, which are not shown, and the like, and motor driver 34 as a drive circuit of stepping motor 25. Microcomputer 32 is configured to detect the rotational position and the rotational amount of transmission gear 26, that is, the rotational position and the rotational amount of sprocket 27 engaging with transmission gear 26, based on a detection signal from optical sensor 28. Feeder controller 30 is communicably connected to mounter controller 70 via connector 29, and these exchange control signals and data with each other. Microcomputer 32 outputs a pulse signal to motor driver 34. Motor driver 34 generates a drive current based on the input pulse signal and outputs the drive current to stepping motor 25. As a result, the multiple coils of stepping motor 25 are sequentially excited, and the stepping motor 25 is rotationally driven. Feeder controller 30 of the present embodiment performs drive control stepping motor 25 with pre-excitation and post-excitation in order to prevent step-out of stepping motor 25. The pre-excitation is energizing stepping motor 25 (coils) by pre-energizing a current (e.g., 0.5 A, etc.) that is lower than the current during rotational driving (e.g., 1.5 A, etc.) before the starting of stepping motor 25, when stepping motor 25 is started in a non-energized state. Thus, feeder controller 30 can correct the positional deviation of the rotor of stepping motor 25 before starting driving stepping motor 25. Also, the post-excitation is, when stopping the driving of stepping motor 25, energizing with a current (e.g., 0.5 A, etc.) lower than the current during rotational driving (e.g., 1.5 A, etc.) after stopping the driving of stepping motor 25. As a result, feeder controller 30 can curtail vibration of the rotor of stepping motor 25 and stop the rotor of stepping motor 25 at an appropriate stop position. Note that, the pre-excitation and the post-excitation are included in the processing during the driving of stepping motor 25, and the pre-excitation may be performed when starting the driving of stepping motor 25, and the post-excitation may be performed when stopping the driving of the stepping motor 25.

As shown in FIG. 3, mounter controller 70 is provided with CPU 71, ROM 72, HDD 73, RAM 74, and input-output interface 75. These items are electrically connected by bus 76. Image signals from mark camera 60, image signals from component camera 62, control signals from feeder controller 30 of feeders 20, and so on are inputted into mounter controller 70 via input-output interface 75. In addition, control signals to board conveyance device 16, control signals to feeder controller 30, drive signals to XY robot 40, control signals to mark camera 60 and component camera 62, drive signals to head 50, and so on are output from mounter controller 70 via input-output interface 75. Examples of a drive signal to head 50 include a drive signal to the R-axis actuator, a drive signal to the θ-axis actuator, a drive signal to the Z-axis actuator, and a drive signal to the electromagnetic valve.

Operation of component mounter 10 thus configured will be described. Mounter controller 70 of component mounter 10 transmits a feed operation instruction as a drive signal to feeder 20 so as to supply the component to the supply position, and performs a pickup operation for picking up the component by moving suction nozzle 51 to the supply position by driving and controlling XY robot 40 and head 50. Mounter controller 70 repeats the feeding operation of components by feeder 20 and the pickup operation by suction nozzle 51 so that the multiple suction nozzles 51 of head 50 each pick up a component. Next, mounter controller 70 performs drive control of XY robot 40 to move the component held by suction nozzle 51 above component camera 62, captures an image of the pickup posture of the component using component camera 62, and processes the obtained image to correct the mounting position. Then, mounter controller 70 performs drive control of XY robot 40 and head 50 to perform a mounting operation for mounting the component at the mounting position on the board. In order to shorten the tact time of pickup operation, in particular, among these operations, mounter controller 70 lowers suction nozzle 51 toward the supply position while feeder 20 is supplying components. Further, mounter controller 70 transmits an instruction to feed the next component to feeder 20 at a timing when suction nozzle 51 holding a component has been raised at the supply position such that the component has been taken out from the cavity of the bottom tape.

Figure 4:
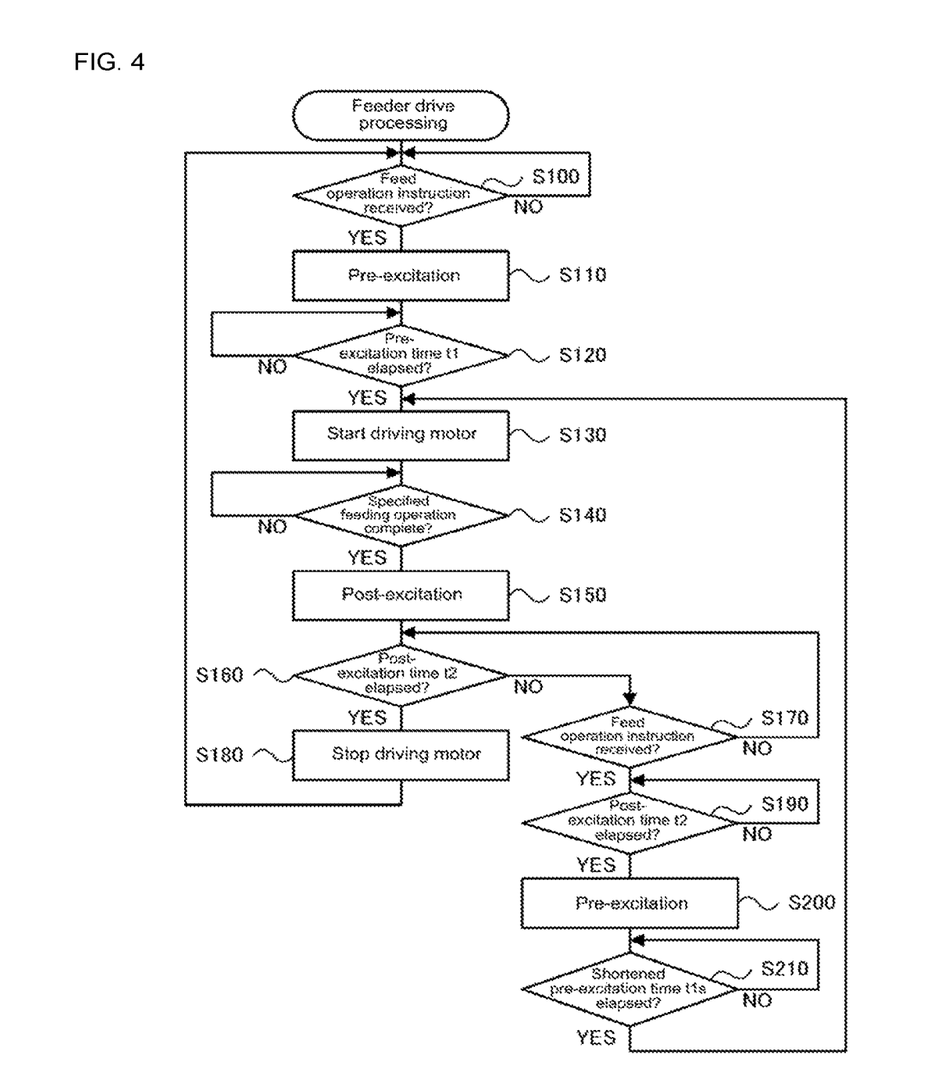
FIG. 4 is a flowchart illustrating an example of feeder drive processing.

Described next is operation of feeder 20. FIG. 4 is a flowchart showing an example of feeder drive processing executed by feeder controller 30. This processing is executed when feeder 20 is connected to the mounter controller 70 via connector 29 and becomes drivable.

When the feeder drive processing is executed, feeder controller 30 first waits to receive a feed operation instruction from mounter controller 70 (S100). Upon receiving the feed operation instruction, feeder controller 30 performs pre-excitation (S110) prior to starting drive rotation of stepping motor 25 and waits for a predetermined pre-excitation time, t1, to elapse (S120). Here, the pre-excitation time t1 is a time of several msec to several tens of msec. Upon determining that the pre-excitation time t1 has elapsed in S120, feeder controller 30 starts drive rotation of stepping motor 25 (S130) and waits for the predetermined feed operation of the carrier tape to be completed (S140). Upon determining that the feeding operation is completed in S140, feeder controller 30 performs post-excitation when stopping the drive rotation of stepping motor 25 (S150). Then, feeder controller 30 waits for the determination of whether predetermined post-excitation time t2 has elapsed (S160), or whether a subsequent feed operation instruction has been received from mounter controller 70 (S170). Here, the post-excitation time t2 is a time of several msec to several tens of msec. With feeder controller 30, when it is determined that post-excitation time t2 has elapsed in S160 before it is determined that the next feed operation instruction has been received in S170, drive rotation of stepping motor 25 is stopped (S180) by stopping the post-excitation and setting stepping motor 25 to a non-excited state, then processing is returned to S100.

On the other hand, if feeder controller 30 determines that the next feed operation instruction has been received from mounter controller 70 in S170 before determining that the post-excitation time t2 has elapsed in S160, the feeder controller 30 performs the following processing. That is, feeder controller 30 waits for the elapse of post-excitation time t2 (S190) similarly to S160, and upon determining in S190 that the post-excitation time t2 has elapsed, feeder controller 30 performs the pre-excitation for the subsequent feed operation (S200). Then, feeder controller 30 waits for shortened pre-excitation time t1s to elapse (S210). Shortened pre-excitation time tis is shorter than predetermined pre-excitation time t1 (by about several msec). Upon determining that shortened pre-excitation time t1s has elapsed, feeder controller 30 starts drive rotation of stepping motor 25 in S130 and performs subsequent processing. That is, in the present embodiment, when an instruction of the next feed operation is received from mounter controller 70 during execution of the post-excitation of the previous feed operation, the current post-excitation and the pre-excitation of the next feed operation are consecutively executed, and the pre-excitation of the next feed operation is performed by shortening the pre-excitation time.

Figure 5:
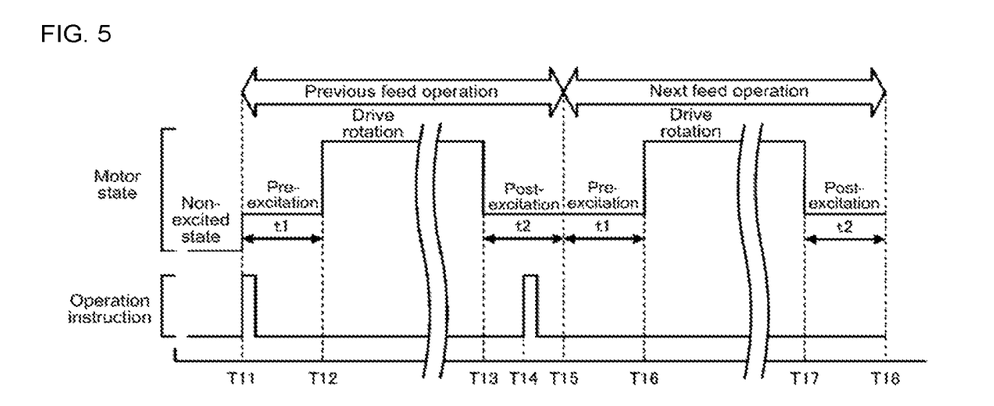
FIG. 5 is a diagram illustrating an excitation time of a comparative example in which a feed operation is continuous.
Figure 6:
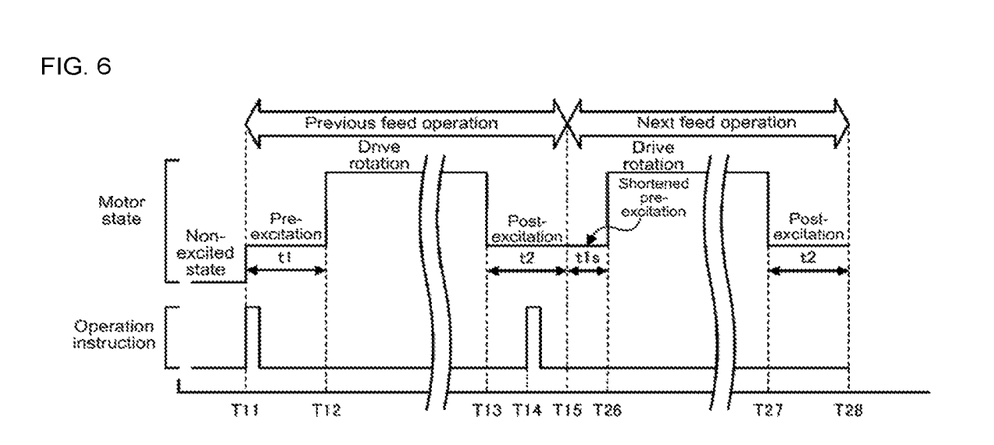
FIG. 6 is a diagram illustrating an excitation time of an embodiment in which a feed operation is consecutive.

FIG. 5 illustrates excitation time of a comparative example in which a feed operation is consecutive. FIG. 6 illustrates excitation time in the embodiment in which a feed operation is continuous. In both FIGS. 5 and 6, feeder controller 30 starts pre-excitation when it receives a feed operation instruction from mounter controller 70 at time T11 at which stepping motor 25 is in a non-excited state. Then, feeder controller 30 drive rotates stepping motor 25 at time T12 at which predetermined pre-excitation time t1 has elapsed, and starts post-excitation at time T13 at which a predetermined amount of feed operation has been completed. Feeder controller 30 performs post-excitation for predetermined post-excitation time t2 from time T13 to time T15. Further, it is assumed that feeder controller 30 receives an operation instruction of the next feed operation from mounter controller 70 at time T14 when the post-excitation is being performed. In the comparative example of FIG. 5, feeder controller 30 performs pre-excitation for predetermined pre-excitation time t1 from the time T15 at which the post-excitation finished, and drive rotates stepping motor 25 at time T16. Then, feeder controller 30 performs post-excitation for predetermined post-excitation time t2 from time T17 to time T18 when the predetermined amount of feed operation has been completed. On the other hand, in the present embodiment of FIG. 6, feeder controller 30 performs pre-excitation for shortened pre-excitation time t1s from time T15 when the post-excitation has finished, and drive rotates stepping motor 25 at time T26. Then, feeder controller 30 performs post-excitation for predetermined post-excitation time t2 from time T27 to time T28 when the predetermined amount of feed operation has been completed. In this manner, in the present embodiment, in a case where the post-excitation and the pre-excitation are consecutive such that feed operation is continuous, because the pre-excitation time is shortened, the total excitation time of the post-excitation and the pre-excitation is shorter than in the comparative example. Therefore, when feeder controller 30 consecutively performs multiple feed operations, it is possible to shorten the time required for the second and subsequent feed operations and shorten the time required for picking up components with each suction nozzle 51 of head 50. Such a time shortening effect is particularly great when component mounter 10 mounts a large number of components. Further, in the case of performing the pre-excitation continuously to the post-excitation, since the drive rotation of stepping motor 25 is started while holding the rotor, which has been brought into the appropriate position by the post-excitation, as is using the pre-excitation, it is possible to prevent the occurrence of a problem such as step-out of stepping motor 25 even if the pre-excitation time is shortened.

Next, correspondences between constituent elements of the present embodiment and constituent elements of the disclosure will be clarified. Stepping motor 25 of the present embodiment corresponds to a stepping motor of the present disclosure, and feeder controller 30 corresponds to a motor control device. Mounter controller 70 corresponds to a drive instructing device. Tape feeding mechanism 24 corresponds to a feeder mechanism, and feeder 20 corresponds to a feeder.

With feeder controller 30 of the present embodiment described above, when performing the post-excitation at the previous stopping of driving of stepping motor 25 and the pre-excitation at the starting of the next driving without going via the non-excited state, the post-excitation and the pre-excitation are consecutively performed for a time shorter than the sum of the predetermined post-excitation time t2 (second time period) and the predetermined pre-excitation time t1 (first time period). As a result, feeder controller 30 can shorten the time from the stopping of the previous driving to the starting of the next driving while curtailing step-out of stepping motor 25, and thus can improve throughput while appropriately operating stepping motor 25.

In addition, feeder controller 30 performs the post-excitation and the pre-excitation consecutively when the instruction of the next feed operation is received during the post-excitation in the case where driving of the forward feed operation of stepping motor 25 is stopped. For this reason, it is possible to easily provide an opportunity for consecutively performing the post-excitation and the pre-excitation with a short excitation time.

Further, when the post-excitation and the pre-excitation are consecutively performed, feeder controller 30 performs the post-excitation for predetermined post-excitation time t2 and performs the pre-excitation for shortened pre-excitation time t1s that is shorter than predetermined pre-excitation time t1. Therefore, feeder controller 30 can smoothly shift to the next drive rotating of stepping motor 25 after appropriately stopping stepping motor 25 by securing the time of the post-excitation.

Meanwhile, it goes without saying that the present disclosure is not limited to the above-mentioned embodiment and various embodiments may be applied within the technical scope of the present disclosure.

For example, in an embodiment described above, when the post-excitation and the pre-excitation are consecutively performed, feeder controller 30 performs the post-excitation for predetermined post-excitation time t2 and performs the pre-excitation for shortened pre-excitation time t1s, but the present disclosure is not limited thereto. Further, for example, feeder controller 30 may perform post-excitation for a time shorter than predetermined post-excitation time t2 and may perform pre-excitation for predetermined pre-excitation time t1. Alternatively, feeder controller 30 may perform post-excitation for a time shorter than predetermined post-excitation time t2 and perform pre-excitation for a time shorter than predetermined pre-excitation time t1.

In an embodiment described above, feeder controller 30 consecutively performs post-excitation and pre-excitation when the drive instruction of the next feed operation is received during post-excitation in a case where stopping of the driving of the previous feed operation is performed, but the present disclosure is not limited thereto. For example, feeder controller 30 may consecutively perform the post-excitation and the pre-excitation when an instruction to drive the next feed operation is received during the drive rotating of the previous feed operation. That is, feeder controller 30 may consecutively perform the post-excitation and the pre-excitation when the drive instruction of the next feed operation is received before completion of the post-excitation of the stopping of the driving of the previous feed operation. Alternatively, feeder controller 30 may consecutively perform the post-excitation and the pre-excitation regardless of the timing at which the drive instruction is received. For example, when performing multiple feed operations, feeder controller 30 may perform control such that the total time of the post-excitation and pre-excitation of consecutive feed operation is always a short excitation time.

Further, in an embodiment described above, the currents in the pre-excitation and the post-excitation are the same, but the present disclosure is not limited to this, and the magnitude of the currents in the pre-excitation and the post-excitation may be different. As described above, the current set for the pre-excitation is mainly necessary for correcting the positional deviation of the rotor of stepping motor 25, and the current set for the post-excitation is mainly necessary for optimizing the stopping position of the rotor of stepping motor 25. Therefore, when the currents in the pre-excitation and the post-excitation are different from each other, securing the current having the larger set value is effective in preventing step-out of stepping motor 25. Therefore, feeder controller 30 may shorten the excitation time for which the set value of the current is smaller and secure the excitation time for which the set value of the current is larger when performing post-excitation and the post-consecutively when the currents in the pre-excitation and the post-excitation are different.

Further, in an embodiment described above, a tape feeder is given as an example of feeder 20, but the present disclosure is not limited to this, and other feeders such as a tray feeder for supplying components from a flat tray accommodating the components may be used. Also, the controller of the stepping motor is not limited to one for controlling stepping motor 25 used in a feeder, and may be one for controlling the stepping motor used in any application.

A motor control device of the present disclosure described above may be configured as follows.

In a motor control device of the present disclosure, drive control of the stepping motor is performed based on a drive instruction from a drive instruction device, and when a next drive instruction is received before the post-excitation during the previous stopping of driving is completed, the post-excitation and the pre-excitation are performed consecutively. In this case, since it is only necessary to determine whether the post-excitation and the pre-excitation are to be performed consecutively before the post-excitation is complete, it is possible to easily provide an opportunity for the post-excitation and the pre-excitation to be performed consecutively with a short excitation time. Note that, when the next drive instruction is received during the post-excitation of the stopping of the previous driving, the post-excitation and the pre-excitation may be performed consecutively.

In a motor control device of the present disclosure, when the post-excitation and the pre-excitation are consecutively performed, the post-excitation is performed for the second time period and the pre-excitation is performed for a time shorter than the first time period. This makes it possible smoothly shift to the next drive rotating of stepping motor 25 after appropriately stopping stepping motor 25 by securing the time of the post-excitation.

INDUSTRIAL APPLICABILITY

The present disclosure can be applied to a manufacturing industry of a device using a stepping motor.

REFERENCE SIGNS LIST

10: component mounter;
11: base;
12: main body frame;
14: support table;
16: board conveyance device;
20: feeder;
21: case;
22: reel;
24: tape feeding mechanism;
25: stepping motor;
25a: gear;
26: transmission gear;
27: sprocket;
28: optical sensor;
29: connector;

30: feeder controller;
32: microcomputer;
34: motor driver;
40: XY robot;
41: X-axis guide rail;
42: X-axis slider;
43: Y-axis guide rail;
44: Y-axis slider;
50: head;
51: suction nozzle;
60: mark camera;
62: component camera;
70: mounter controller;
71: CPU;
72: ROM;
73: HDD;
74: RAM;
75: input and output interface;
76: bus;
S: board

The invention claimed is:

1. A component mounter, comprising:
   a mounter controller, and
   a feeder to feed components in a carrier tape, the feeder including:
   a stepping motor,
   a transmission gear driven by the stepping motor,
   a sprocket including sprocket teeth that engage with the transmission gear,
   a tape feeding mechanism that engages the sprocket teeth with sprocket holes of the carrier tape, the tape feeding mechanism intermittently rotates the sprocket via the stepping motor to pitch feed the carrier tape,
   a motor control device configured to perform drive control of the stepping motor,
   a motor driver that generates a current to drive the stepping motor, and
   a processor configured to
   perform a pre-excitation by instructing the motor driver to energize the stepping motor for a first time period at a first current lower than a second current used during driving of the stepping motor before starting driving of the stepping motor,
   perform post-excitation such that the motor control device stops the stepping motor at an appropriate stop position by instructing the motor driver to energize the stepping motor for a second time period at a third current lower than the second current used during the driving of the stepping motor when stopping the driving of the stepping motor for a feed operation of the components by the feeder,
   perform the post-excitation and the pre-excitation consecutively for a time that is shorter than a sum of the first time period and the second time period when performing the post-excitation during a previous stopping of the driving of the stepping motor and the pre-excitation during a subsequent starting of the driving of the stepping motor without an intervening non-excited state, and
   receive a drive instruction to perform the drive control of the stepping motor from the mounter controller, the drive instruction corresponding to an instruction to drive the carrier tape to a mounting position, and when a next drive instruction of the components is received from the mounter controller before the post-excitation during the previous stopping of driving is completed, the post-excitation and the pre-excitation are performed consecutively.

2. The component mounter according to claim 1, wherein, when the post-excitation and the pre-excitation are consecutively performed, the post-excitation is performed for the second time period and the pre-excitation is performed for a time shorter than the first time period.

* * * * *